(12) United States Patent
D'Evelyn et al.

(10) Patent No.: US 6,806,508 B2
(45) Date of Patent: Oct. 19, 2004

(54) HOMOEPITAXIAL GALLIUM NITRIDE BASED PHOTODETECTOR AND METHOD OF PRODUCING

(75) Inventors: Mark Philip D'Evelyn, Niskayuna, NY (US); Nicole Andrea Evers, Niskayuna, NY (US); Kanin Chu, Nashua, NH (US)

(73) Assignee: General Electic Company, Niskayuna, NY (US)

( * ) Notice: Subject to any disclaimer, the term of this patent is extended or adjusted under 35 U.S.C. 154(b) by 0 days.

(21) Appl. No.: 09/839,941

(22) Filed: Apr. 20, 2001

(65) Prior Publication Data

US 2002/0155634 A1 Oct. 24, 2002

(51) Int. Cl.[7] .............................................. H01L 33/00

(52) U.S. Cl. ..................... 257/103; 257/79; 257/85; 257/103; 257/190; 257/200

(58) Field of Search ........................... 257/18, 22, 85, 257/94, 103, 191, 200, 201, 190

(56) References Cited

U.S. PATENT DOCUMENTS

| | | | | |
|---|---|---|---|---|
| 4,905,136 A | * | 2/1990 | Müeller et al. ............ | 356/419 |
| 5,637,531 A | | 6/1997 | Porowski et al. | |
| 5,679,152 A | * | 10/1997 | Tischler ...................... | 117/97 |
| 5,698,865 A | * | 12/1997 | Gerner et al. ................ | 257/94 |
| 5,770,887 A | | 6/1998 | Tadatomo et al. | |
| 5,810,925 A | | 9/1998 | Tadatomo et al. | |
| 6,034,404 A | * | 3/2000 | Soares ........................ | 257/415 |
| 6,104,074 A | * | 8/2000 | Chen .......................... | 257/453 |
| 6,121,634 A | * | 9/2000 | Saito et al. .................. | 257/86 |
| 6,225,650 B1 | * | 5/2001 | Tadatomo et al. .......... | 257/190 |
| 6,258,466 B1 | * | 7/2001 | McTeer ...................... | 428/627 |
| 6,377,596 B1 | * | 4/2002 | Tanaka et al. ............... | 372/45 |

FOREIGN PATENT DOCUMENTS

| | | |
|---|---|---|
| EP | 0 937 790 | 8/1999 |
| WO | WO 95/04845 | 2/1995 |

OTHER PUBLICATIONS

Elsevier, Materials Science & Engineering B44, "*Growth and Properties of Single Crystalline GaN Substrates and Homoepitaxial Layers*", S. Porowski, pp. 407–413, 1997.

Elsevier, Diamond and Related Materials, "*Ammono Method of GaN and AlN Production*", R. Dwilinski et al., Vol. 7, pp. 1348–1350, 1998.

MRS Internet Journal of Nitride Semiconductor Research, "*Near Defect Free GaN Substrates*", S. Porowski, Vol. 4S1, G1.3, 1999.

Chem. Material, "*Ammonothermal Synthesis of Cubic Gallium Nitride*", Andrew P. Purdy, vol. 11, pp. 1648–1651, 1999.

(List continued on next page.)

*Primary Examiner*—Long Pham
*Assistant Examiner*—Wai-Sing Louie
(74) *Attorney, Agent, or Firm*—Robert P. Santandrea; Patrick K. Patnode

(57) ABSTRACT

A photodetector comprising a gallium nitride substrate, at least one active layer disposed on the substrate, and a conductive contact structure affixed to the active layer and, in some embodiments, the substrate. The invention includes photodetectors having metal-semiconductor-metal structures, P-i-N structures, and Schottky-barrier structures. The active layers may comprise $Ga_{1-x-y}Al_xIn_yN_{1-z-w}P_zAs_w$, or, preferably, $Ga_{1-x}Al_xN$. The gallium nitride substrate comprises a single crystal gallium nitride wafer and has a dislocation density of less than about $10^5$ cm$^{-2}$. A method of making the photodetector is also disclosed.

99 Claims, 5 Drawing Sheets

OTHER PUBLICATIONS

Materials Research Society Symp. Proc., *"Materials Chemistry and Bulk Crystal Growth of Group III Nitrides in Supercritical Ammonia"*, Joseph W. Kolis et al., vol. 495, pp. 367–372, 1998.

MRS Internet J. Nitride Semicond. Res. 4S1, G10.2, *"GaN Homoepitaxy for Device Applications"*, M. Kamp et al., 1999.

Application RD–27,007—*"Crystalline Gallium Nitride and Method for Forming Crystalline Gallium Nitride"*.

Application RD–27,904—*"Homoepitaxial Gallium–Nitride–Based Light Emitting Device and Method for Producing"*.

* cited by examiner

HOMOEPITAXIAL GALLIUM NITRIDE BASED PHOTODETECTOR AND METHOD OF PRODUCING

BACKGROUND OF THE INVENTION

The invention relates to crystalline gallium nitride. In particular, the invention relates to a homoepitaxial gallium nitride based photodetector and a method of producing the same.

During the past decade there has been tremendous interest in gallium nitride (GaN) based optoelectronic devices, including, for example, light emitting diodes (LEDs) and laser diodes (LDs). Because high-quality GaN substrates have not been available, virtually all of the art has involved heteroepitaxial deposition of GaN and GaInAlN on sapphire or SiC substrates. A thin low-temperature buffer layer, typically AlN or GaN, is used in order to accommodate the lattice mismatch between GaN and the substrate and maintain an epitaxial relationship to the substrate.

Several processes are currently used to produce crystalline gallium nitride substrates. The processes include heteroepitaxial growth of gallium nitride on a substrate, such as a sapphire or silicon carbide. The heteroepitaxial growth process often results in defects including high concentrations of dislocations, vacancies, or impurities. These defects may have undesirable and detrimental effects on epitaxially grown gallium nitride, and may adversely influence operation of the resultant gallium nitride-based device. These adverse influences include compromised electronic performance and operation. Presently, heteroepitaxial gallium nitride growth processes require complex and tedious steps to reduce defect concentrations in the gallium nitride.

Known growth processes do not provide large gallium nitride crystals of high quality (i.e.; crystals having low dislocation densities); for example, gallium nitride crystals greater than about 0.8 inches (about 2 centimeters) in diameter or greater than about 0.01 inches (about 250 microns) in thickness. Further, the known methods are not known to provide for production of large gallium nitride crystals that result in single-crystal gallium nitride boules, for example gallium nitride crystals of about 1 inch in diameter and about 0.5 inches in thickness, which are suitable for forming wafers. Thus, applications for gallium nitride are limited due to size constraints.

Known methods of producing large-area GaN wafers yield wafers having rather high (>$10^6$ cm$^{-2}$) concentrations of threading dislocations. As is the case in heteroepitaxial devices, high concentrations of such defects degrade device performance.

Also, most known gallium nitride crystal production processes do not provide high-quality gallium nitride crystals with low concentrations of impurities and dislocations with adequate size and growth rates that are acceptable for device applications. Further, the known gallium nitride crystal production processes are not believed to provide an economical process having nitride growth rates that enable moderate-cost gallium nitride crystal production. Therefore, applications for gallium nitride are further limited due to quality and cost-of-production factors.

Use of gallium nitride crystal has been limited in photodetector applications because of the quality and manufacturing issues discussed above. A high-performance photodetector could be used, for example, to control the temperature in the combustor of power-generation turbines or in aircraft engines, allowing continuous, real-time optimization of combustion conditions and improved energy efficiency and reliability. Photodetectors could also be used in a wide variety of sensor applications, both civilian and military. While current buffer-layer technology allows for production of commercially viable GaN-based LEDs and LDs, the photodetectors that can be produced with current technology are marginal in performance because of very high defect levels.

Growth of homoepitaxial photodetectors on high-quality GaN substrates would offer improved sensitivity, increased efficiency, reduced leakage (dark) current, and increased breakdown field. Other potential benefits of homoepitaxial photodetectors include increased temperature of operation, better reliability, better device uniformity, improved backside contact capability, higher manufacturing yield, longer lifetime, enhanced wafer utilization, improved wavelength selectivity, and better manufacturability.

Accordingly, there is a need in the art for an improved GaN based photodetector.

BRIEF SUMMARY OF THE INVENTION

The present invention meets this need and others by providing a photodetector having a gallium nitride substrate, a gallium nitride substrate for a photodetector device, and a method of producing such a photodetector.

The photodetector of the present invention includes a gallium nitride substrate, at least one active layer disposed on the substrate, and a conductive contact structure affixed to the active layer and, in some embodiments, the substrate. In one embodiment of the invention, the photodetector has a metal-semiconductor-metal (MSM) type structure, in which an insulating active layer is deposited on the gallium nitride substrate, and the conductive contact structure is a patterned array of interdigitated Schottky-type (i.e., rectifying) metallic contacts connected to the semi-insulating active layer.

Another embodiment of the invention is a photodetector having a P-i-N structure. The photodetector includes either an n-doped gallium nitride substrate or an n-doped active layer deposited on the substrate, an insulating active layer, and a p-doped active layer. In this embodiment, the conductive contact structure comprises at least one ohmic-type contact connected to the p-type active layer and an ohmic contact connected to the substrate.

The photodetector of the present invention also encompasses a third embodiment, which is a Schottky-barrier structure, in which an insulating active layer is deposited on the gallium nitride substrate, and the conductive contact structure comprises at least one Schottky-type contact connected to the insulating active layer and an ohmic contact connected to the substrate.

Accordingly, one aspect of the present invention is to provide a photodetector comprising: a gallium nitride substrate; at least one active layer disposed on the gallium nitride substrate; and at least one conductive contact structure affixed to at least one of the gallium nitride substrate and the active layer.

A second aspect of the present invention is to provide a gallium nitride substrate for a photodetector. The gallium nitride substrate comprises a single crystal gallium nitride wafer and has a dislocation density of less than about $10^5$ cm$^{-2}$.

A third aspect of the present invention is to provide a photodetector. The photodetector comprises: a gallium nitride substrate, the gallium nitride substrate comprising a single crystal gallium nitride wafer and having a dislocation density of less than about $10^5$ cm$^{-2}$; at least one active layer disposed on the gallium nitride substrate, the active layer comprising $Ga_{1-x-y}Al_xIn_yN_{1-z-w}P_zAs_w$, wherein $0 \leq x, y, z, w \leq 1$, $0 \leq x+y \leq 1$, and $0 \leq z+w \leq 1$; and at least one conductive contact structure affixed to at least one of the gallium nitride substrate and the active layer.

A fourth aspect of the invention is to provide a method of making a photodetector, the photodetector comprising a gallium nitride substrate, at least one active layer disposed on the gallium nitride substrate, and at least one conductive contact structure affixed to at least one of the gallium nitride substrate and the active layer. The method comprises the steps of: providing a gallium nitride substrate; depositing at least one active layer on the gallium nitride substrate; and affixing a conductive connecting structure to at least one of the at least one active layer and the gallium nitride substrate.

These and other aspects, advantages, and salient features of the invention will become apparent from the following detailed description, the accompanying drawings, and the appended claims.

LIST OF FIGURES

DETAILED DESCRIPTION OF THE INVENTION

Figure 1:
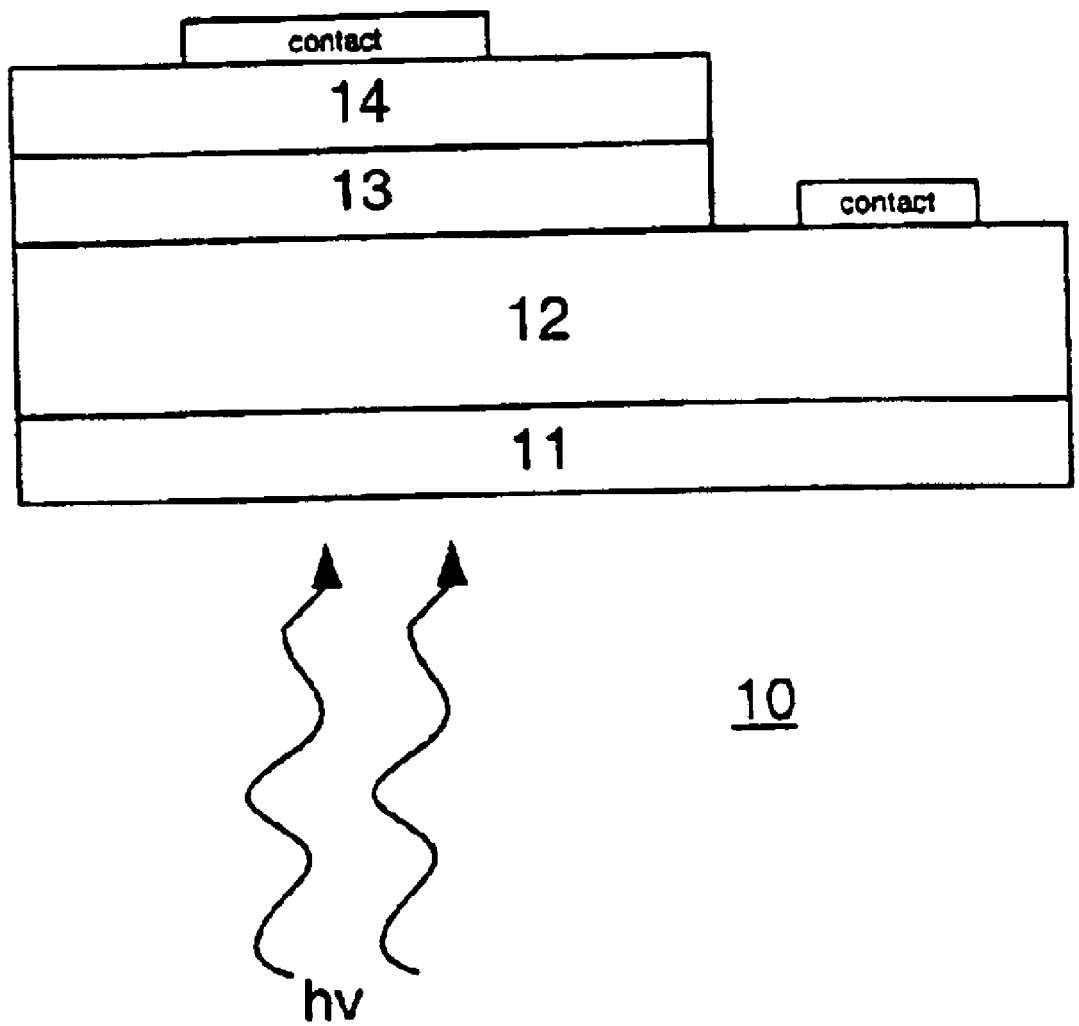
FIG. 1 is a schematic depiction of a prior art photodetector.

In the following detailed description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto. FIG. 1 depicts a prior art GaN/AlGaN on sapphire mesa p-i-n photodetector 10. Photodetector 10 comprises a sapphire substrate layer 11, an n-type AlGaN ohmic contact layer 12, an intrinsic GaN absorption layer 13, and a p-type GaN ohmic contact layer 14. The sapphire substrate layer 11 is transparent to the GaN absorption layers so it can detect the optical field from the backside. Layer 12 is comprises an n-type AlGaN layer and an n-type metal contact layer, such as Ti/Al/Ti/Au, which is deposited onto the AlGaN layer and annealed to form an ohmic contact. Layer 14 comprises a p-type AlGaN layer and a p-type metal layer, such as, but not limited to, Ni/Au, which is deposited onto the AlGaN layer and annealed to form an ohmic contact. The photodiode is operated by reverse biasing the junction. This is done by applying a positive voltage to the n-type metal contact layer 12. Under these conditions, the current is approximately independent of the voltage, but is proportional to the rate of optical generation of carriers. Layer 13 is the GaN intrinsic region where the photons are absorbed and generate electron/hole pairs that are drawn to opposites sides of the junction by the electric field where they then contribute to the detector current.

Figure 2:
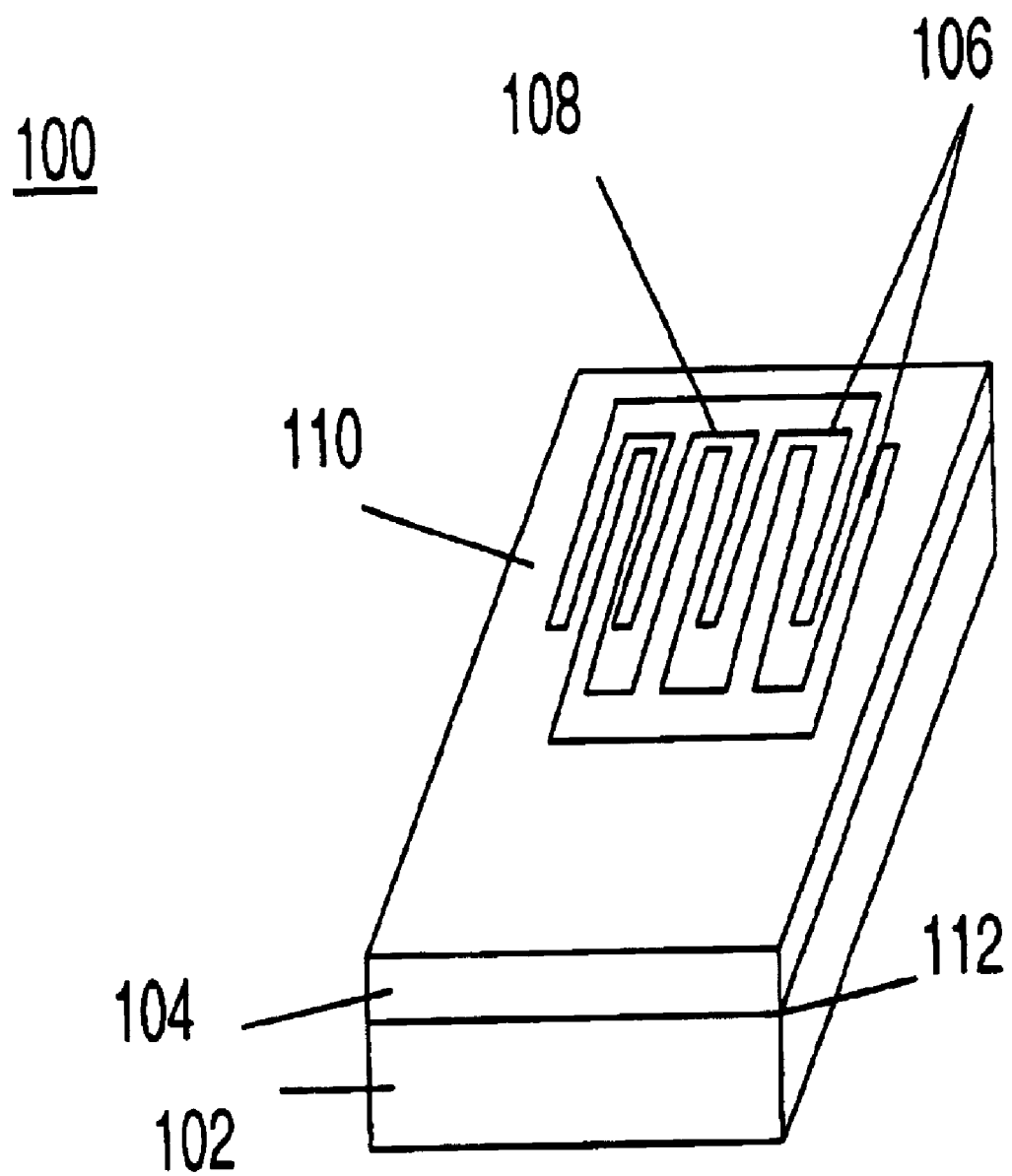
FIG. 2 is a schematic depiction of a photodetector in accordance with one embodiment of the instant invention.

In accordance with one embodiment of the instant invention, shown in FIG. 2, an exemplary embodiment of a metal-semiconductor-metal (MSM) photodetector 100 comprises a gallium nitride substrate 102, at least one active layer 104 disposed on the gallium nitride substrate 102, and at least one conductive contact structure 106 affixed to the at least one active layer 104, as shown in FIG. 2. In one embodiment, at least one active layer 104 comprises $Ga_{1-x-y}Al_xIn_yN_{1-z-w}P_zAs_w$, wherein $0 \leq x, y, z, w \leq 1$, $0 \leq x+y \leq 1$, and $0 \leq z+w \leq 1$. In another embodiment, at least one active layer 104 comprises $Ga_{1-x}Al_xN$, wherein $0 \leq x \leq 1$.

In one embodiment, the GaN substrate for the device fabrication consists of an (0001)-oriented GaN wafer cut from a boule that was grown using a supercritical solvent at a temperature greater than about 550° C. and a pressure greater than about 5 kbar.

More specifically, one suitable process for forming the GaN substrate comprises providing a source gallium nitride, solvent, and mineralizer. The source gallium nitride may comprise at least one of poorly-crystallized gallium nitride, well-crystallized gallium nitride, amorphous gallium nitride, polycrystalline gallium nitride, and combinations thereof. The source gallium nitride may be provided "as-is" in its raw form. Alternatively, the source gallium nitride can be compacted into a "pill" or sintered into a polycrystalline compact. Alternatively, the source gallium nitride can be formed in situ by providing gallium metal which then reacts with the ammonia solvent after sealing of the capsule and treatment at high pressure and high temperature to form source gallium nitride.

The source gallium nitride may then be combined with at least one of the mineralizer and solvent to form a mixture. The gallium nitride, solvent, and mineralizer may optionally be provided individually to the capsule as separate and distinct un-combined materials. The mixture, which can comprise gallium nitride and at least one of the solvent and mineralizer, can be optionally compacted into a pill, however the compacting of the mixture need not be conducted in the gallium nitride growth process.

The source gallium nitride, solvent, and mineralizerare then placed inside a capsule as either a compacted or uncompacted mixture. Optionally, additional mineralizer can also be added to the capsule. The capsule, which will be described hereinafter, can then be filled with a nitrogen-containing solvent, for example at least one of ammonia or hydrazine, or an organic solvent, including but not limited to, methylamine, melamine, ethylene diamine, and mixtures thereof. The capsule is then sealed, disposed in a pressure cell, and subjected to high pressure and high temperature conditions in an appropriate high pressure high temperature (HPHT) system. The HPHT conditions are maintained for a length of time sufficient to dissolve the source gallium nitride and re-precipitate it onto at least one gallium nitride crystal, gallium nitride boule, or gallium nitride crystal seed.

Maintaining HPHT conditions yields large single gallium nitride crystals, for example single gallium nitride crystals having a diameter and thickness in a range from about 0.02 inch (about 0.05 cm) to about 12 inches (about 30 cm) and, for example, a size in a range from about 2 inches to about 6 inches. The pressure, as embodied by the invention, is in a range from greater than about 5 kbar to about 80 kbar, and the temperature for the gallium nitride crystal growth process is in a range between about 550° C. and about 3000° C. The GaN single crystals thus formed are substantially transparent, with an absorption coefficient below 100 cm$^{-1}$. Furthermore, the substrates of the present invention have carrier mobilities above about 100 cm$^2$/V-s and strain, with respect to undoped GaN homoepitaxial layers, below about 0.005%.

After being held at high temperature and high pressure for the desired period, the HPHT system is allowed to cool and the high pressure is relieved. The gallium nitride crystals are then removed from the HPHT system and pressure cell and washed in water and mineral acids. The mineral acids for washing the gallium nitride crystals include, but are not limited to, hydrochloric acid (HCl) and nitric acid (HNO$_3$).

The mineralizers, as embodied by the invention, comprise at least one of alkali, alkaline-earth, and rare earth nitrides such as, but not limited to: at least one of Li$_3$N, Mg$_3$N$_2$, and Ca$_3$Na$_2$; amides, such as LiNH$_2$, NaNH$_2$, and KNH$_2$; urea and related compounds; ammonium salts, such as NH$_4$F and NH$_4$Cl; halide, sulfide, and nitrate salts, such as NaCl, CeCl$_3$, Li$_2$S, and KNO$_3$; lithium salts; and combinations thereof. The mineralizers may be provided as solids or as additives dissolved in fluids, such as solvents. The use of alkaline-earth or rare-earth mineralizers have the additional advantage of acting as a getter for adventitious oxygen in the growth medium, allowing for the growth of undoped GaN crystals with low n-type carrier density. Alternatively, the mineralizer can be formed in situ. At least one of lithium, sodium, potassium, rubidium, cesium, magnesium, calcium, strontium, barium or a rare-earth metal may be provided, which then reacts with the ammonia solvent to form the mineralizer.

The filling and sealing steps will now be described. The capsule is filled with a nitrogen-containing solvent, such as at least one of ammonia or hydrazine or an organic solvent, including, but not limited to methylamine, melamine, or ethylenediamine, without admitting air or water, which are undesirable in the gallium nitride formation process. To fill the capsule without admitting air or water, the capsule is filled and connected to a negative pressure source, such as a vacuum manifold, and evacuated. The capsule is then chilled to a temperature below room temperature (preferably about −72° C. or below) and vapor-phase solvent can be admitted to the manifold. The vapor-phase solvent then condenses in the capsule. For example, if the nitrogen-containing solvent comprises ammonia, the condensation can be performed at dry ice or liquid-nitrogen temperatures.

The capsule can then be isolated so as to seal the capsule by closing a valve to the negative pressure source. The capsule can then be separated from at least one of the manifold or the valve by a pinching-off step using a cold welding apparatus, which is well known in the art. The pinching-off step is particularly effective if the capsule is copper. The integrity of the seal may be enhanced by optional arc welding.

The capsule and pressure cell comprise any appropriate form that permits the gallium nitride growth process to withstand the high pressure and high temperature as embodied by the invention. The HPHT system that applies the high pressures and high temperatures can comprise a press device, which may include at least one of a die and punch. For example, the press device comprises one of: a piston-cylinder press; a belt press; a tetrahedral-, cubic-, or octahedral-anvil press; a recessed-anvil press; a split-sphere press; and a toriod-type press, each of which are known to those of skill in the art.

The foregoing description of the process for forming the GaN crystal substrate is intended to be illustrative only, and should not be construed in any limiting sense. Other methods for forming the crystal will be obvious to those skilled in the art, but are intended to fall within the scope of the present disclosure.

The GaN crystal formed is of high quality as determined by a measurement of dislocation density. The dislocation density is determined by performing transmission electron microscopy (TEM) on a thin section, as is well known in the art. A GaN crystal of the immediate invention contains less than about 10$^5$ threading dislocations per cm$^2$ and, preferably, less than about 10$^3$ dislocations per cm$^2$.

After the crystal has been formed, the substrate for the device fabrication is cut from a boule formed by the method described above. The wafer may either comprise n-type GaN, with an electrical resistivity less than about 1000 Ω-cm, more preferably less than about 100 Ω-cm, or even more preferably less than about 10 Ω-cm, or insulating GaN, having a resistivity of at least about 10$^5$ Ω-cm. The substrate is then polished to a mirror finish using mechanical-polishing techniques that are well known in the art. Subsurface damage may remain after the polishing process. This damage may be removed by several methods that are known in the art, including chemically assisted ion beam etching or chemo-mechanical polishing. The residual damage may also be removed by heating the wafer to a temperature between about 900 and 1500° C. in an atmosphere containing ammonia at a partial pressure between about 10$^{-8}$ mbar and 20,000 bar. The substrate preferably has a thickness between about 0.01 and 10 mm, most preferably between about 0.05 and 5 mm.

The wafer used in the present invention preferably has a gallium nitride wurtzite-type crystal structure. Moreover, the GaN wafers have a (0001) crystallographic orientation, preferably with a Ga-terminated (0001) face and an N-terminated (000$\bar{1}$) face. It is expected that the (0001) Ga face will be superior for deposition of photodetector device structures.

In the exemplary embodiment shown in FIG. 2, the photodetector 100 has a metal-semiconductor-metal (MSM) structure having at least one active layer 104. The at least one active layer 104 is an insulating layer disposed on a surface of substrate 102 and, in one embodiment, comprises Ga$_{1-x-y}$Al$_x$In$_y$N$_{1-z-w}$P$_z$As$_w$, wherein 0≦x, y, z, w≦1, 0≦x+y≦1, and 0≦x+w≦1. In another embodiment, the at least one active layer 104 comprises Ga$_{1-x}$Al$_x$N, wherein 0≦x≦1. The insulating layer 104 can be doped or undoped, and typically has a thickness in the range between about 1 nm to about 10 microns. Additionally, insulating layer 104 typically has a carrier concentration of up to about 10$^{18}$ cm$^{-3}$. Substrate 102 comprises either n-doped or insulating gallium nitride. Conductive contact structure 106, comprising a plurality of Schottky contacts 108, is disposed on a surface 110 of insulating layer 104. As shown in FIG. 2, Schottky contacts 108 are interdigitated with respect to each other. Typically, Schottky contacts 108 are made of nickel and gold. A portion of a respective Schottky contact 108 that contacts insulating layer 104 is preferably a contact layer (not shown) comprising at least one of nickel and a nickel-rich nickel-gold composition. Typically, the contact layer is contacted with at least one of gold and a gold-rich nickel-gold composition.

Metallic contacts are good electrical conductors, but have the disadvantage of having poor optical transparency, which decreases the light-collecting efficiency of the photodetector.

This can be overcome by using conductive metal oxides such as, but not limited to, tin oxide and indium oxide instead of, or in combination with, the corresponding metal. Among the materials that may be used as Schottky or ohmic contacts are palladium, platinum, gold, aluminum, tin, indium, chromium, nickel, titanium, and oxides thereof. Additional materials that may be used as ohmic contacts include, but are not limited to, scandium, zirconium, tantalum, tungsten, copper, silver, hafnium, and rare earth metals.

In the embodiment shown in FIG. 2, Schottky contacts 108 may be sputtered onto surface 110 of insulating layer 104. Alternatively, Schottky contacts 108 may be deposited onto surface 110 of insulating layer 104 by electron beam evaporation. While sputtering and electron beam evaporation are discussed here, these processes are not to be considered limitations of the instant invention. In fact, any equivalent process can be used to deposit Schottky contacts 108 onto surface 110. In another embodiment, an n-doped layer 112 is disposed between substrate 102 and insulating layer 104.

Figure 3:
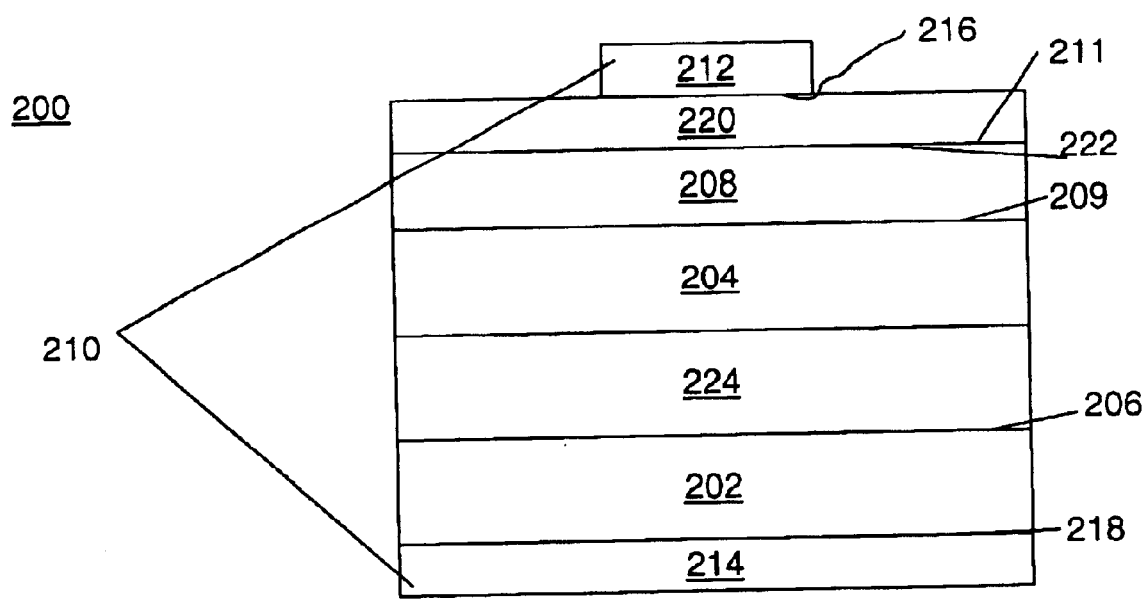
FIG. 3 is a schematic depiction of a photodetector in accordance with another embodiment of the instant invention.

In the exemplary embodiment shown in FIG. 3, the photodetector 200 has a P-i-N structure which includes a n-doped substrate 202, an insulating layer 204 disposed on a surface 206 of n-doped substrate 202 and a first p-doped layer 208 disposed on a surface 209 of insulating layer 204 opposite n-doped substrate 202, as shown in FIG. 3. Insulating layer 204 and first p-doped layer 208 each have a nominal thickness in the range between about 1 nm to about 10 microns. Insulating layer 204 has a nominal carrier concentration of up to about $10^{18}$ cm$^{-3}$.

A conductive contact structure 210 typically comprises a first ohmic contact 212, typically made of nickel and gold. The first ohmic contact 212 is affixed to said the first p-doped layer 208 and a second ohmic contact 214, typically made of titanium and aluminum, is affixed to the n-type substrate 202.

A portion of the first ohmic contact 212 that contacts first p-doped layer 208 is a contact layer 216 made of at least one of nickel and a nickel-rich nickel-gold composition. Typically, the contact layer 216 is contacted with an overlayer 217 comprising at least one of gold and a gold-rich nickel-gold composition. Among the materials that may be used as the first ohmic contact 212 to the first p-doped layer 208 are palladium, platinum, gold, aluminum, tin, indium, chromium, nickel, titanium, and oxides thereof. It is understood that these materials may be used to form an ohmic contact with any of the p-doped layers described herein.

In the embodiment shown in FIG. 3, the first ohmic contact 212 may sputtered onto a surface 211 of the first p-doped layer 208. Alternatively, the first ohmic contact 212 may be deposited onto surface 211 of the first p-doped layer 208 by electron beam evaporation. While sputtering and electron beam evaporation are discussed here, these processes are not to be considered limitations of the instant invention. In fact, any equivalent process can be used to deposit first ohmic contact 212 onto surface 211.

In the embodiment shown in FIG. 3, a portion of the second ohmic contact 214 that contacts n-type substrate 202 is preferably a contact layer 218 typically comprising a titanium-rich titanium-aluminum composition. Typically, the contact layer 218 is contacted with an overlayer 219 having an aluminum-rich titanium-aluminum composition. Materials that may be used as the second ohmic contact 214 that contacts n-type substrate 202 include, but are not limited to, aluminum, scandium, titanium, zirconium, tantalum, tungsten, nickel, copper, silver, gold, hafnium, and rare earth metals. It is understood that these materials may be used to form an ohmic contact with any of the n-doped layers described herein.

In the embodiment shown in FIG. 3, the second ohmic contact 214 may be sputtered onto n-type substrate 202. Alternatively, second ohmic contact 214 may be deposited onto the n-type substrate 202 by electron beam evaporation. While sputtering and electron beam evaporation are discussed here, these processes are not to be considered limitations of the instant invention. In fact, any equivalent process can be used to deposit second ohmic contact 214 onto n-type substrate 202.

In the embodiment shown in FIG. 3, photodetector 200 may further comprise a second p-doped layer 220 comprising, for example, p-doped aluminum gallium nitride, disposed on a surface 211 of the first p-doped layer 208 opposite insulating layer 204. The photodetector may further comprise an n-doped layer 224, comprising, for example, n-doped gallium nitride, disposed between n-doped substrate 202 and insulating layer 204. In one embodiment of the invention shown in FIG. 3, insulating layer 204, first p-doped layer 208, second p-doped layer 220, and n-doped layer 224 each comprise $Ga_{1-x}Al_xN$, wherein $0 \leq x \leq 1$. In another embodiment, insulating layer 204, first p-doped layer 208, second p-doped layer 220, and n-doped layer 224 each comprise $Ga_{1-x-y}Al_xIn_yN_{1-z-w}P_zAs_w$, wherein $0 \leq x, y, z, w \leq 1$, $0 \leq x+y \leq 1$, and $0 \leq z+w \leq 1$.

Figure 4:
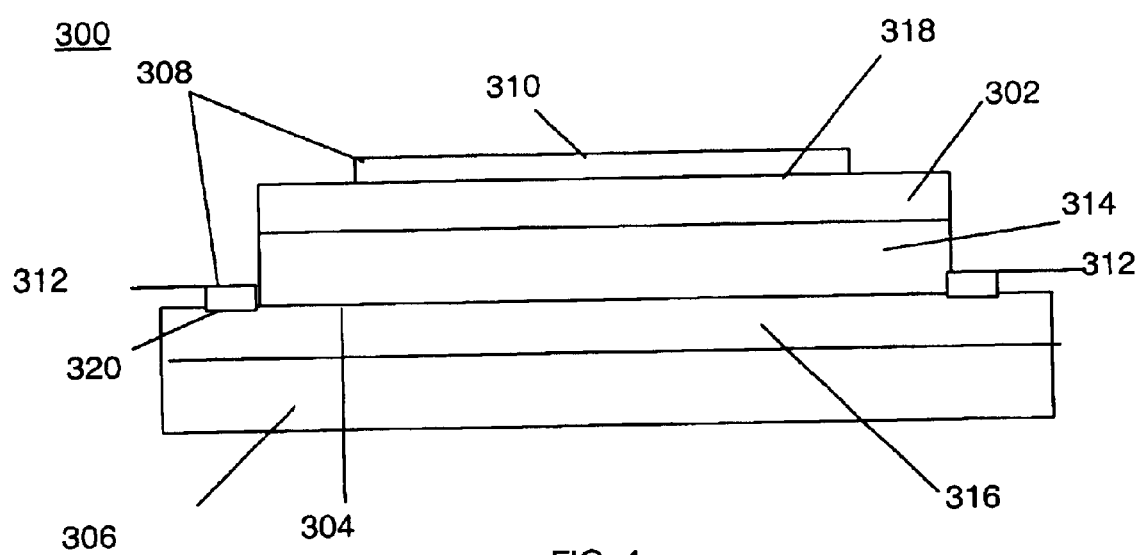
FIG. 4 is a schematic depiction of a photodetector in accordance with another embodiment of the instant invention.

In the exemplary embodiment shown in FIG. 4, the photodetector 300 is a Schottky barrier device in which at least one active layer 302 comprises an insulating layer disposed on a surface 304 of a substrate 306, which is typically either an n-doped or insulating GaN substrate, and a conductive contact structure 308 comprising at least one Schottky contact 310, typically made of nickel and gold, affixed to insulating layer 302 and at least one ohmic contact 312, typically made of titanium and aluminum, is affixed to substrate 306. The insulating layer 302 has a nominal carrier concentration of up to about $10^{18}$ cm$^{-3}$.

In the embodiment shown in FIG. 4, photodetector 300 may further comprise a first n-doped layer 314 disposed between substrate 306 and insulating layer 302. The first n-doped layer 314 has a nominal thickness in the range between about 1 nm to about 10 microns. In another embodiment, photodetector 300 may further comprise a second n-doped layer 316, typically comprising n-doped gallium nitride, that is disposed between substrate 306 and first n-doped layer 314. In this embodiment, the substrate 306 is typically an insulating GaN substrate. The second n-doped layer 316 contacts at least one ohmic contact 312. Second n-doped layer 316 has a nominal thickness in the range between about 1 nm to about 10 microns. In one embodiment of the invention shown in FIG. 4, active (which, in this example, is insulating) layer 302, first n-doped layer 314, and second n-doped layer 316 each comprise $Ga_{1-x}Al_xN$, wherein $0 \leq x \leq 1$. In another embodiment, active (which, in this example, is insulating) layer 302, first n-doped layer 314, and second n-doped layer 316 each comprise $Ga_{1-x-y}Al_xIn_yN_{1-z-w}P_zAs_w$, wherein $0 \leq x, y, z, w \leq 1$, $0 \leq x+y \leq 1$, and $0 \leq z+w \leq 1$.

A portion of at least one Schottky contact 310 that contacts insulating layer 302 is preferably a contact layer 318 that comprises at least one of nickel and a nickel-rich nickel-gold composition. Typically, contact layer 318 is contacted with an overlayer 319 comprising at least one of gold and a gold-rich nickel-gold composition. At least one Schottky contact 310 has a nominal thickness in the range between about 0.001 microns to about 10 microns.

In the embodiment shown in FIG. 4, the at least one Schottky contact 310 may be sputtered onto insulating layer 302. Alternatively, Schottky contact 310 may be deposited onto insulating layer 302 by electron beam evaporation. While sputtering and electron beam evaporation are discussed here, these processes are not to be considered limitations of the instant invention. In fact, any equivalent process can be used to deposit Schottky contact 310 onto insulating layer 302.

A portion of at least one ohmic contact 312 that contacts substrate 306 is a contact layer 320, preferably made of a titanium-rich titanium-aluminum composition. Typically, contact layer 320 is contacted with an overlayer 321 having an aluminum-rich titanium-aluminum composition.

In one embodiment, at least one ohmic contact 312 is sputtered onto substrate 306. Alternatively, ohmic contacts 312 are deposited onto substrate 306 by electron beam evaporation. While sputtering and electron beam evaporation are discussed here, these processes are not to be considered limitations of the instant invention. In fact, any equivalent process can be used to deposit ohmic contacts 312 onto substrate 306.

In one embodiment, at least one of substrate 102, 202, 306 and at least one of active layer 104, 204, 302 further comprise at least one n-dopant, typically selected from the group consisting of silicon, germanium, and oxygen. The n-dopant is typically epitaxially deposited in at least one of substrate 102, 202, 306 and at least one active layer 104, 204, 302. Alternatively, the n-dopant is implanted in at least one of substrate 102, 202, 306 and at least one active layer 104, 204, 302.

In another embodiment of the present invention, at least one of substrate 102, 202, 306 and at least one of active layer 104, 204, 302 further comprise at least one p-dopant, typically selected from the group consisting of magnesium, calcium, and beryllium. The p-dopant is typically epitaxially deposited in at least one of substrate 102, 202, 306 and at least one active layer 104, 204, 302. Alternatively, p-dopant is implanted in at least one of substrate 102, 202, 306 and at least one active layer 104, 204, 302.

In one embodiment, photodetector 100, 200, 300 is used in a flame detector adapted to detect a flame in a combustion chamber (not shown). The stoichiometry of each of the active layers 104, 204, 302 determines the sensitivity of respective photodetector 100, 200, 300 to particular wavelengths of electromagnetic radiation. More specifically, the relative amounts of the different metals in the active layer—for example, the relative amounts of aluminum and gallium in $Ga_{1-x}Al_xN$—determine the wavelength range to which the photodetector 100, 200, 300 will respond. Photodetector 100, 200, 300 can thus be tuned to detect specific wavelengths of radiation by depositing an active layer 104, 204, 302 having the appropriate composition. A combination of at least two flame detectors may be used to monitor two different emission ranges for flame temperature determination. In another embodiment, substrate 102, 202, 306 is a gallium nitride substrate comprising a single crystal gallium nitride wafer and having a nominal dislocation density of less than about $10^5$ cm$^{-2}$. Gallium nitride substrate 102, 202, 306 has a nominal resistivity of at least about $10^5$ Ω-cm. Alternatively, the gallium nitride substrate 102, 202, 306 has a resistivity of less than about 10 Ω-cm. Gallium nitride substrate 102, 202, 306 preferably has a nominal dislocation density of less than about $10^3$ cm$^{-2}$.

The gallium nitride wafer has a nominal diameter in the range between about 3 mm to about 150 mm. Preferably, the gallium nitride wafer has a diameter in the range between about 12 mm and about 150 mm. Most preferably, the gallium nitride wafer has a diameter in the range between about 20 mm to about 150 mm. The gallium nitride wafer typically has a (0001) crystallographic orientation.

Figure 5:
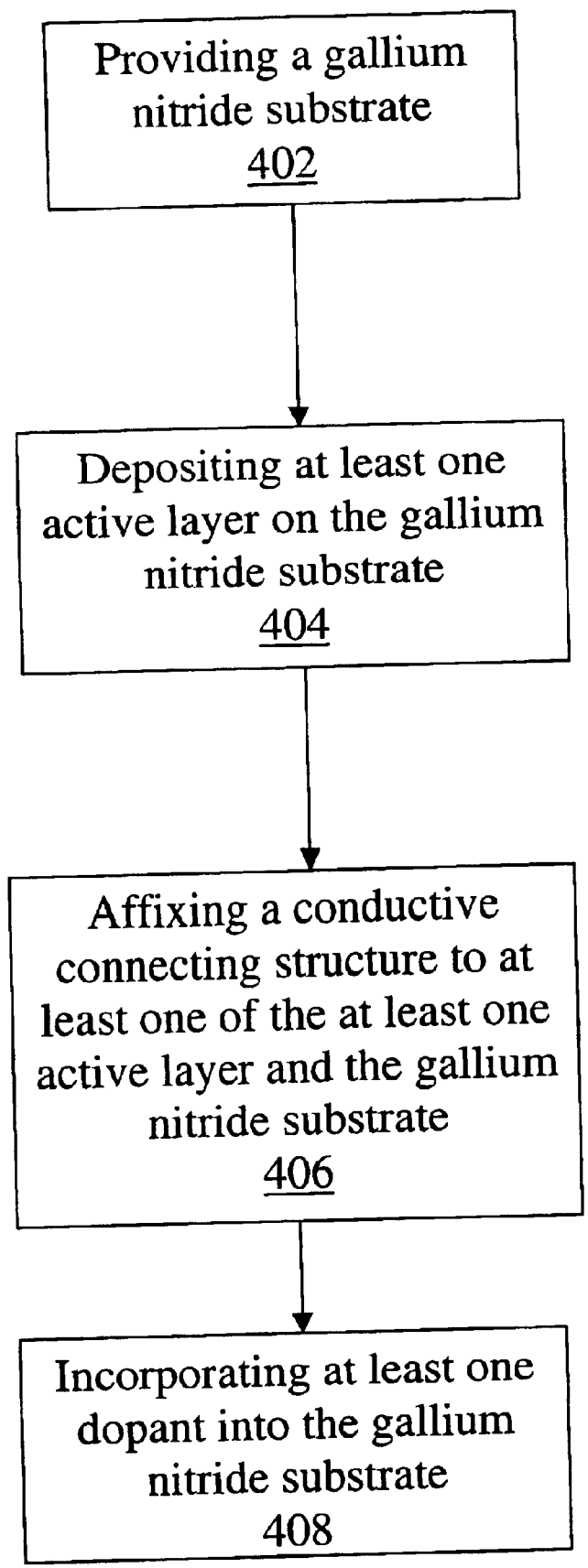
FIG. 5 is a flow chart depicting method steps in accordance with one embodiment of the instant invention.

A method 400 of making a photodetector 100, 200, 300, wherein the photodetector 100, 200, 300 comprises a gallium nitride substrate 102, 202, 306, at least one active layer 104, 204, 302 disposed on gallium nitride substrate 102, 202, 306 and at least one conductive contact structure 106, 210, 308 affixed to at least one of gallium nitride substrate 102, 202, 306 and active layer 104, 204, 302, is shown in the flow chart of FIG. 5.

Method 400 comprises the steps of: 402 providing a gallium nitride substrate (102, 202, 306); 404 depositing at least one active layer (104, 204, 302) on the gallium nitride substrate (102, 202, 306); and 406 affixing a conductive connecting structure (106, 210, 308) to at least one of the at least one active layer (104, 204, 302) and the gallium nitride substrate (102, 202, 306).

Step 404, which comprises depositing at least one active layer (104, 204, 302) on the gallium nitride substrate (102, 202, 306), typically comprises depositing at least one active layer (104, 204, 302) by metal organic vapor phase epitaxy or, alternatively, by molecular beam epitaxy.

Step 406, which comprises affixing a conductive connecting structure 106, 210, 308 to at least one of the active layer (104, 204, 302) and gallium nitride substrate (102, 202, 306) may include either sputter-depositing a metallic layer on at least one of the at least one active layer (104, 204, 302) and the gallium nitride substrate (102, 202, 306) or, alternatively, electron beam evaporating a metallic layer on at least one of the at least one active layer (104, 204, 302) and the gallium nitride substrate (102, 202, 306).

In one embodiment, method 400 further includes the step 408 of incorporating at least one dopant into the gallium nitride substrate (102, 202, 306).

Step 408, which comprises incorporating at least one dopant into the gallium nitride substrate (102, 202, 306), may comprise epitaxially depositing a doped layer on the gallium nitride substrate (102, 202, 306), preferably by metal organic vapor phase epitaxy. Alternatively, the dopant may be incorporated into the gallium nitride substrate (102, 202, 306) by implanting the dopant in the gallium nitride substrate (102, 202, 306).

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A photodetector, said photodetector, comprising:
  a) a substrate, said substrate comprising a homoepitaxially grown single crystal gallium nitride wafer having a dislocation density of less than about $10_3$ cm$^{-2}$;
  b) at least one active layer disposed on said substrate; and
  c) at least one conductive contact structure affixed to at least one of said substrate and said at least one active layer.

2. The photodetector of claim 1, wherein said at least one active layer comprises $Ga_{1-x-y}Al_xIn_yN_{1-z-w}P_zAs_w$, wherein $0 \leq x, y, z, w \leq 1$ and at least one of x and y have a non-zero value, $0 \leq x+y \leq 1$, and $0 \leq z+w \leq 1$.

3. The photodetector of claim 2, wherein said at least one active layer comprises $Ga_{1-x}Al_xN$, wherein $0 \leq x \leq 1$.

4. The photodetector of claim 1, wherein said conductive contact structure comprises at least one of a Schottky contact and an ohmic contact.

5. The photodetector of claim 4, wherein said contact comprises said Schottky contact comprising at least one of a metal and a metal oxide selected from the group consisting of palladium, platinum, gold, aluminum, tin, indium, chromium, nickel, titanium, and oxides thereof.

6. The photodetector of claim 5, wherein said Schottky contact comprises nickel and gold.

7. The photodetector of claim 6, wherein a portion of said Schottky contact that contacts said at least one active layer is a contact layer comprising at least one of nickel and a nickel-rich nickel-gold composition.

8. The photodetector of claim 7, wherein said contact layer is contacted with at least one of gold and a gold-rich nickel-gold composition.

9. The photodetector of claim 6, wherein said Schottky contact has a thickness of between about 0.001 microns and about 10 microns.

10. The photodetector of claim 4, wherein said contact comprises said ohmic contact affixed to one of an n-doped active layer and said substrate, and wherein said ohmic contact comprises at least one metal selected from the group consisting of aluminum, scandium, titanium, zirconium, tantalum, tungsten, nickel, copper, silver, gold, hafnium, and rare earth metals.

11. The photodetector of claim 10, wherein said ohmic contact comprises titanium and aluminum.

12. The photodetector of claim 11, wherein a portion of said ohmic contact that contacts said substrate is a contact layer comprising a titanium-rich titanium-aluminum composition.

13. The photodetector of claim 12, wherein said contact layer is contacted with an aluminum-rich titanium-aluminum composition.

14. The photodetector of claim 4, wherein said ohmic contact is affixed to a p-doped active layer, and wherein said ohmic contact comprises at least one of a metal and a metal oxide selected from the group consisting of palladium, platinum, gold, aluminum, tin, indium, chromium, nickel, titanium, and oxides thereof.

15. The photodetector of claim 14, wherein said ohmic contact comprises gold and nickel.

16. The photodetector of claim 15, wherein a portion of said ohmic contact that contacts said p-doped active layer is a contact layer comprising at least one of nickel and a nickel-rich nickel-gold composition.

17. The photodetector of claim 16, wherein said contact layer is contacted with at least one of gold and a gold-rich nickel-gold composition.

18. The photodetector of claim 4, wherein at least one of said Schottky contact and said ohmic contact is sputtered onto said substrate.

19. The photodetector of claim 4, wherein at least one of said Schottky contact and said ohmic contact is deposited onto said substrate by electron beam evaporation.

20. The photodetector of claim 1, wherein said at least one active layer includes an insulating layer disposed on a surface of said substrate, said insulating layer having a resistivity of at least $10^5$ Ω-cm.

21. The photodetector of claim 20, wherein said insulating layer has a thickness of between about 1 mm and about 10 microns.

22. The photodetector of claim 20, wherein said insulating layer has a carrier concentration of up to about $10^{18}$ cm$^{-3}$.

23. The photodetector of claim 1, wherein said at least one active layer comprises an insulating layer disposed on a surface of said substrate, wherein said substrate is one of a n-doped substrate and an insulating substrate, and wherein said conductive contact structure comprises a plurality of Schottky contacts disposed on a surface of said insulating layer.

24. The photodetector of claim 23, wherein said plurality of Schottky contacts are interdigitated with respect to each other.

25. The photodetector of claim 23, wherein said insulating layer is undoped.

26. The photodetector of claim 23, further including a n-doped layer disposed between said substrate and said insulating layer.

27. The photodetector of claim 26, wherein said n-doped layer is n-doped gallium nitride.

28. The photodetector of claim 1, wherein said substrate is an n-doped substrate, and wherein said at least one active layer comprises:
 a) an insulating layer disposed on a surface of said n-doped substrate; and
 b) a first p-doped layer disposed on a surface of said insulating layer opposite said n-doped substrate,
 wherein said conductive contact structure comprises a first ohmic contact affixed to said first p-doped layer and a second ohmic contact affixed to said n-doped substrate.

29. The photodetector of claim 28, further comprising a second p-doped layer disposed on a surface of said first p-doped layer opposite said insulating layer.

30. The photodetector of claim 29, wherein said second p-doped layer is p-doped gallium nitride.

31. The photodetector of claim 28, wherein said insulating layer and said first p-doped layer each have a thickness of between about 1 nm and about 10 microns.

32. The photodetector of claim 28, further comprising an n-doped layer disposed between said n-doped substrate and said insulating layer.

33. The photodetector of claim 1, wherein said at least one active layer comprises an insulating layer disposed on a surface of said substrate, and wherein said conductive contact structure comprises at least one Schottky contact affixed to said insulating layer and at least one ohmic contact affixed to one of said substrate and a first n-doped layer.

34. The photodetector of claim 33, wherein said substrate is an n-doped substrate.

35. The photodetector of claim 33, wherein said first n-doped layer is disposed between said substrate and said insulating layer.

36. The photodetector of claim 33, wherein said first n-doped layer has a thickness of between about 1 nm and about 10 microns.

37. The photodetector of claim 33, further comprising a second n-doped layer disposed between said substrate and said first n-doped layer, said second n-doped layer contacting said at least one ohmic contact.

38. The photodetector of claim 37, wherein said second n-doped layer comprises n-doped gallium nitride.

39. The photodetector of claim 37, wherein said second n-doped layer has a thickness of between about 1 nm and about 10 microns.

40. The photodetector of claim 1, wherein at least one of said substrate and said at least one active layer further comprises at least one n-dopant.

41. The photodetector of claim 40, wherein said at least one n-dopant is a dopant selected from the group consisting of silicon, germanium, and oxygen.

42. The photodetector of claim 40, wherein said at least one n-dopant is epitaxially deposited in at least one of said substrate and said at least one active layer.

43. The photodetector of claim 40, wherein said at least one n-dopant is implanted in at least one of said substrate and said at least one active layer.

44. The photodetector of claim 1, wherein at least one of said substrate and said active layer further comprises at least one p-dopant.

45. The photodetector of claim 44, wherein said at least one p-dopant is a dopant selected from the group consisting of magnesium, calcium, and beryllium.

46. The photodetector of claim 44, wherein said at least one p-dopant is epitaxially deposited in at least one of said substrate and said at least one active layer.

47. The photodetector of claim 44, wherein said at least one p-dopant is implanted in at least one of said substrate and said at least one active layer.

48. The photodetector of claim 1, wherein said photodetector is a flame detector adapted to detect a flame in a combustion chamber.

49. The photodetector of claim 1, wherein said photodetector is capable of detecting a predetermined wavelength of radiation in the visible and ultraviolet regions of the spectrum of electromagnetic radiation.

50. A photodetector, said photodetector comprising:
    a) a gallium nitride substrate, said gallium nitride substrate comprising a homoepitaxially grown single crystal gallium nitride wafer having a dislocation density of less than about $10^5$ cm$^{-2}$;
    b) at least one active layer disposed on said gallium nitride substrate, said at least one active layer comprising $Ga_{1-x-y}Al_xIn_yN_{1-z-w}P_zAs_w$, wherein $0 \leq x, y, z, w \leq 1$ and at least one of x and y have a non-zero value, wherein $0 < x+y \leq 1$, and $0 \leq z+w \leq 1$; and
    c) at least one conductive contact structure affixed to at least one of said gallium nitride substrate and said at least one active layer.

51. The photodetector of claim 50, wherein said at least one active layer comprises $Ga_{1-x}Al_xN$, wherein $0 \leq x \leq 1$.

52. The photodetector of claim 50, wherein said conductive contact structure comprises at least one of a Schottky contact and an ohmic contact.

53. The photodetector of claim 52, wherein said contact comprises said Schottky contact comprising at least one of a metal and a metal oxide selected from the group consisting of palladium, platinum, gold, aluminum, tin, indium, chromium, nickel, titanium, and oxides thereof.

54. The photodetector of claim 53, wherein said Schottky contact comprises nickel and gold.

55. The photodetector of claim 54, wherein a portion of said Schottky contact that contacts said at least one active layer is a contact layer comprising at least one of nickel and a nickel-rich nickel-gold composition.

56. The photodetector of claim 55, wherein said contact layer is contacted with at least one of gold and a gold-rich nickel-gold composition.

57. The photodetector of claim 53, wherein said Schottky contact has a thickness of between about 0.001 microns and about 10 microns.

58. The photodetector of claim 52, wherein said contact comprises said ohmic contact affixed to one of an n-doped active layer and said substrate, and wherein said ohmic contact comprises at least one metal selected from the group consisting of aluminum, scandium, titanium, zirconium, tantalum, tungsten, nickel, copper, silver, gold, hafnium, and rare earth metals.

59. The photodetector of claim 58, wherein said ohmic contact comprises titanium and aluminum.

60. The photodetector of claim 59, wherein a portion of said ohmic contact that contacts said substrate is a contact layer comprising a titanium-rich titanium-aluminum composition.

61. The photodetector of claim 60, wherein said contact layer is contacted with an aluminum-rich titanium-aluminum composition.

62. The photodetector of claim 52, wherein said ohmic contact is affixed to a p-doped active layer, and wherein said ohmic contact comprises at least one of a metal and a metal oxide selected from the group consisting of palladium, platinum, gold, aluminum, tin, indium, chromium, nickel, titanium, and oxides thereof.

63. The photodetector of claim 62, wherein said ohmic contact comprises gold and nickel.

64. The photodetector of claim 63, wherein a portion of said ohmic contact that contacts said p-doped active layer is a contact layer comprising at least one of nickel and a nickel-rich nickel-gold composition.

65. The photodetector of claim 64, wherein said contact layer is contacted with at least one of gold and a gold-rich nickel-gold composition.

66. The photodetector of claim 52, wherein at least one of said Schottky contact and said ohmic contact is sputtered onto said substrate.

67. The photodetector of claim 52, wherein at least one of said Schottky contact and said ohmic contact is deposited onto said substrate by electron beam evaporation.

68. The photodetector of claim 50, wherein said at least one active layer includes an insulating layer disposed on a surface of said substrate, said insulating layer having a resistivity of at least $10^5$ $\mu$-cm.

69. The photodetector of claim 68, wherein said insulating layer has a thickness of between about 1 nm and about 10 microns.

70. The photodetector of claim 68, wherein said insulating layer has a carrier concentration of up to about $10^{18}$ cm$^{-3}$.

71. The photodetector of claim 50, wherein said at least one active layer comprises an insulating layer disposed on a surface of said gallium nitride substrate, wherein said gallium nitride substrate is one of a n-doped gallium nitride substrate and an insulating gallium nitride substrate, and wherein said conductive contact structure comprises a plurality of Schottky contacts disposed on a surface of said insulating layer.

72. The photodetector of claim 71, wherein said plurality of Schottky contacts are interdigitated with respect to each other.

73. The photodetector of claim 71, wherein said insulating layer is undoped.

74. The photodetector of claim 71, further including an n-doped layer disposed between said gallium nitride substrate and said insulating layer.

75. The photodetector of claim 74, wherein said n-doped layer is n-doped gallium nitride.

76. The photodetector of claim 50, wherein said gallium nitride substrate is a n-doped gallium nitride substrate, and wherein said at least one active layer comprises:
    a) an insulating layer disposed on a surface of said n-doped gallium nitride substrate; and
    b) a first p-doped layer disposed on a surface of said insulating layer opposite said n-doped gallium nitride substrate,
    wherein said conductive contact structure comprises at least one ohmic contact affixed to said first p-doped layer and at least one ohmic contact affixed to said n-doped gallium nitride substrate.

77. The photodetector of claim 76, further comprising a second p-doped layer disposed on a surface of said first p-doped layer opposite said insulating layer.

78. The photodetector of claim 77, wherein said second p-doped layer is p-doped gallium nitride.

79. The photodetector of claim 76, wherein said insulating layer and said first p-doped layer each have a thickness of between about 1 nm and about 10 microns.

80. The photodetector of claim 76, further comprising a first n-doped layer disposed between said n-doped gallium nitride substrate and said insulating layer.

81. The photodetector of claim 50, wherein said at least one active layer comprises an insulating layer disposed on a surface of said gallium nitride substrate, and wherein said conductive contact structure comprises at least one Schottky contact affixed to said insulating layer and at least one ohmic contact affixed to one of said gallium nitride substrate and a first n-doped layer.

82. The photodetector of claim 81, wherein said gallium nitride substrate is an n-doped gallium nitride substrate.

83. The photodetector of claim 81, wherein said first n-doped layer is disposed between said gallium nitride substrate and said insulating layer.

84. The photodetector of claim 83, wherein said first n-doped layer has a thickness of between about 1 nm and about 10 microns.

85. The photodetector of claim 83, further comprising a second n-doped layer disposed between said gallium nitride substrate and said insulating layer, said second n-doped layer contacting said at least one ohmic contact.

86. The photodetector of claim 85, wherein said second n-doped layer comprises n-doped gallium nitride.

87. The photodetector of claim 85, wherein said second n-doped layer has a thickness of between about 1 nm and about 10 microns.

88. The photodetector of claim 50, wherein at least one of said gallium nitride substrate and said at least one active layer further comprises at least one n-dopant.

89. The photodetector of claim 88, wherein said at least one n-dopant is a dopant selected from the group consisting of silicon, germanium, and oxygen.

90. The photodetector of claim 88, wherein said at least one n-dopant is epitaxially deposited in at least one of said gallium nitride substrate and said at least one active layer.

91. The photodetector of claim 88, wherein said at least one n-dopant is implanted in at least one of said gallium nitride substrate and said at least one active layer.

92. The photodetector of claim 50, wherein at least one of said gallium nitride substrate and said active layer further comprises at least one p-dopant.

93. The photodetector of claim 92, wherein said at least one p-dopant is a dopant selected from the group consisting of magnesium, calcium, and beryllium.

94. The photodetector of claim 92, wherein said at least one p-dopant is epitaxially deposited in at least one of said gallium nitride substrate and said at least one active layer.

95. The photodetector of claim 92, wherein said at least one p-dopant is implanted in at least one of said gallium nitride substrate and said at least one active layer.

96. The photodetector of claim 50, wherein said photodetector is a flame detector adapted to detect a flame in a combustion chamber.

97. The photodetector of claim 50, wherein, said photodetector is capable of detecting a predetermined range of wavelengths of radiation in the visible and ultraviolet regions of the spectrum of electromagnetic radiation.

98. A photodetector, said photodetector, comprising:
a) a substrate, said substrate comprising a homoepitaxially grown single crystal gallium nitride wafer having a dislocation density of less than about $10^3$ cm$^{-2}$ cut from a portion of a boule grown by precipitating gallium nitride onto at least one of a gallium nitride crystal, a gallium nitride boule, and a gallium nitride crystal seed using a supercritical solvent at a temperature greater than about 550° C. and a pressure greater than about 5 kbar;
b) at least one active layer disposed on said substrate; and
c) at least one conductive contact structure affixed to at least one of said substrate and said at least one active layer.

99. A photodetector, said photodetector comprising:
a) a substrate, said substrate comprising a homoepitaxially grown single crystal gallium nitride wafer having a dislocation density of less than about $10^5$ cm$^{-2}$ cut from a portion of a boule grown by precipitating gallium nitride onto at least one of a gallium nitride crystal, a gallium nitride boule, and a gallium nitride crystal seed using a supercritical solvent at a temperature greater than about 550° C. and a pressure greater than about 5 kbar;
b) at least one active layer disposed on said gallium nitride substrate, said at least one active layer comprising $Ga_{1-x-y}Al_xIn_yN_{1-z-w}P_zAs_w$, wherein $0 \leq x, y, z, w \leq 1$ and at least one of x and y have a non-zero value, wherein $0 < x+y \leq 1$, and $0 \leq z+w \leq 1$; and
c) at least one conductive contact structure affixed to at least one of said gallium nitride substrate sand said at least one active layer.

* * * * *

UNITED STATES PATENT AND TRADEMARK OFFICE
CERTIFICATE OF CORRECTION

PATENT NO. : 6,806,508 B2
DATED : October 19, 2004
INVENTOR(S) : Mark Philip D'Evelyn et al.

It is certified that error appears in the above-identified patent and that said Letters Patent is hereby corrected as shown below:

<u>Title page,</u>
Item [73], Assignee, replace "General Electic Company" with -- General Electric Company --

<u>Column 4,</u>
Line 46, replace "mineralizerare" with -- mineralizer are --

<u>Column 10,</u>
Line 59, replace "$10_3$ cm$^{-2}$" with -- $10^3$ cm$^{-2}$ --

<u>Column 11,</u>
Line 64, replace "1 mm" with -- 1 nm --

<u>Column 14,</u>
Line 33, replace "$\mu$-cm" with -- $\Omega$-cm --

Signed and Sealed this

Eighth Day of February, 2005

JON W. DUDAS
*Director of the United States Patent and Trademark Office*